(12) United States Patent
Lee et al.

(10) Patent No.: US 8,963,325 B2
(45) Date of Patent: Feb. 24, 2015

(54) POWER DEVICE AND POWER DEVICE MODULE

(71) Applicant: Samsung Electronics Co., Ltd., Suwon-Si, Gyeonggi-Do (KR)

(72) Inventors: Baik-woo Lee, Gwangmyeong-si (KR); Young-hun Byun, Seoul (KR); Seong-woon Booh, Yongin-si (KR); Chang-mo Jeong, Hanam-si (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 13/739,372

(22) Filed: Jan. 11, 2013

(65) Prior Publication Data

US 2014/0021620 A1 Jan. 23, 2014

(30) Foreign Application Priority Data

Jul. 18, 2012 (KR) .................. 10-2012-0078391

(51) Int. Cl.
*H01L 29/40* (2006.01)
*H01L 21/44* (2006.01)
*H01L 23/498* (2006.01)
*H01L 21/02* (2006.01)
*H01L 23/00* (2006.01)
*H01L 23/373* (2006.01)

(52) U.S. Cl.
CPC .... *H01L 23/49866* (2013.01); *H01L 21/02697* (2013.01); *H01L 24/03* (2013.01); *H01L 2224/03424* (2013.01); *H01L 2224/03464* (2013.01); *H01L 2224/0508* (2013.01); *H01L 2224/05644* (2013.01); *H01L 2224/05664* (2013.01); *H01L 2224/06181* (2013.01); *H01L 2224/291* (2013.01); *H01L 2224/29139* (2013.01); *H01L 2224/32225* (2013.01); *H01L 2224/45147* (2013.01); *H01L 2224/48227* (2013.01); *H01L 2224/73265* (2013.01); *H01L 2924/3511* (2013.01); *H01L 23/3735* (2013.01); *H01L 2924/13055* (2013.01); *H01L 2924/13091* (2013.01); *H01L 2924/3011* (2013.01)
USPC ........... 257/734; 257/750; 257/765; 257/771; 257/781; 257/E23.159; 438/197; 438/666; 438/686; 438/687; 438/688

(58) Field of Classification Search
USPC ......... 257/678, 766, 773, 779–782, 734, 750, 257/765, 771, 781, E23.159; 438/149, 197, 438/612, 652, 666, 686, 687, 688
See application file for complete search history.

(56) References Cited

U.S. PATENT DOCUMENTS

| | | | |
|---|---|---|---|
| 8,440,524 B2 * | 5/2013 | Fujiwara et al. | 438/253 |
| 2010/0181675 A1 | 7/2010 | Reynoso et al. | |
| 2011/0316160 A1 | 12/2011 | Siepe et al. | |

FOREIGN PATENT DOCUMENTS

| | | | |
|---|---|---|---|
| JP | 2000323593 A | 11/2000 | |
| KR | 1020060092536 A | 8/2006 | |
| KR | 1020090050751 A | 5/2009 | |
| KR | 1020110132522 A | 12/2011 | |

* cited by examiner

*Primary Examiner* — Jasmine Clark

(74) *Attorney, Agent, or Firm* — Harness, Dickey & Pierce, PLC

(57) ABSTRACT

According to example embodiments of inventive concepts, a power device includes a semiconductor structure having a first surface facing a second surface, an upper electrode, and a lower electrode. The upper electrode may include a first contact layer that is on the first surface of the semiconductor structure, and a first bonding pad layer that is on the first contact layer and is formed of a metal containing nickel (Ni). The lower electrode may include a second contact layer that is under the second surface of the semiconductor structure, and a second bonding pad layer that is under the second contact layer and is formed of a metal containing Ni.

30 Claims, 6 Drawing Sheets

POWER DEVICE AND POWER DEVICE MODULE

CROSS-REFERENCE TO RELATED APPLICATIONS

This application claims priority under 35 U.S.C. §119 to Korean Patent Application No. 10-2012-0078391, filed on Jul. 18, 2012, in the Korean Intellectual Property Office, the disclosure of which is incorporated herein in its entirety by reference.

BACKGROUND

1. Field

Example embodiments relate to power devices and power device modules, and more particularly, to power devices including electrodes for improved electrical connection, and power device modules including the power devices.

2. Description of the Related Art

Power semiconductor devices for handling relatively large power of hundreds of kilowatts (KW) to several megawatts (MW) may be used in inverter circuits such as industrial motors or vehicle motors, power supply apparatuses of large storage servers, and interruptible power supply apparatuses. Examples of power semiconductor devices include semiconductor switches, such as metal-oxide-semiconductor field-effect transistors (MOSFETs) and insulated-gate bipolar transistors (IGBTs).

The role of packaging for a power semiconductor device is to protect the power semiconductor device from the external environment and to connect the power semiconductor device to an external circuit or an external electrode. However, it may be desirable for the packaging of a power device, such as a switch or a power module, to reduce (and/or minimize) internal impedance, reduce the effect of an electromagnetic field on an internal electrode, ensure optimal insulation, increase a life span, and reduce costs.

When a power semiconductor device is electrically connected to an external system, the power semiconductor device may function appropriately. In order to electrically connect a power semiconductor device and an external system, an interconnect technology such as wire bonding and/or soldering may be used. With interconnect technology, the properties of electrodes formed on the power semiconductor device may be important.

SUMMARY

Example embodiments of inventive concepts relate to power devices employing an electrode structure that may be easily connected to an external system by using a copper (Cu) wire or by using soldering or sintering, and power device modules including the power devices. Also, example embodiments of inventive concepts relate to methods of manufacturing power devices that may reduce the number of processes for forming electrodes.

Additional aspects will be set forth in part in the description which follows and, in part, will be apparent from the description, or may be learned by practice of example embodiments of inventive concepts.

According to example embodiments of inventive concepts, a power device includes a semiconductor structure having a first surface facing a second surface, an upper electrode on the first surface of the semiconductor structure, and a lower electrode arranged so the second surface of the semiconductor structure is on the lower electrode. The upper electrode includes a first contact layer that is on the first surface, and a first bonding pad layer that is on the first contact layer. The first bonding pad layer includes a metal containing nickel (Ni). The lower electrode includes a second contact layer that is under the second surface of the semiconductor structure, and a second bonding pad layer that is under the second contact layer. The second bonding pad layer includes a metal containing Ni.

In example embodiments of inventive concepts, a material of the first contact layer may be the same material as a material of the second contact layer. In example embodiments of inventive concepts, a material of the first bonding layer may be the same as a material the second bonding pad layer.

In example embodiments of inventive concepts, each of the first bonding pad layer and the second bonding pad layer may include at least one of phosphorus (P) and boron (B) as an impurity.

In example embodiments of inventive concepts, the first contact layer and the second contact layer may each include a metal containing aluminum (Al).

In example embodiments of inventive concepts, the upper electrode may further include a first protective layer and the lower electrode may further include a second protective layer. The first protective layer may be on the first bonding pad layer and may protect the first bonding pad layer. The second bonding pad layer may be on the second protective layer. The second protective layer may protect the second bonding pad layer.

In example embodiments of inventive concepts, the first protective layer and the second protective layer may each include at least one of gold (Au) and palladium (Pd).

In example embodiments of inventive concepts, the first protective layer may include: a first Pd layer having a metal containing Pd that is on the first bonding pad layer; and a first Au layer having a metal containing Au that is on the first Pd layer. In example embodiments of inventive concepts, the second protective layer may include: a second Pd layer having a metal containing Pd that supports the second bonding pad layer, and a second Au layer having a metal containing Au that supports the second Pd layer.

In example embodiments of inventive concepts, the upper electrode may include a plurality of the upper electrodes that are spaced apart from one another.

In example embodiments of inventive concepts, the semiconductor structure may include one of an insulated-gate bipolar transistor (IGBT) and a metal-oxide-semiconductor field-effect transistor (MOSFET). In example embodiments of inventive concepts, the semiconductor structure may include a diode.

According to example embodiments of inventive concepts, a power device module includes: a semiconductor structure having a first surface facing a second surface; an upper electrode; a lower electrode; a direct bonded copper (DBC) substrate; and a copper (Cu) wire. The upper electrode is on the first surface of the semiconductor structure. The upper electrode includes a first bonding pad layer that is on the first contact layer and includes a metal containing nickel (Ni). The lower electrode is arranged so the second surface of the semiconductor structure is on the lower electrode. The lower electrode includes a second contact layer that is under the second surface of the semiconductor structure, and the lower electrode includes a second bonding pad layer that includes a metal containing Ni. The direct bonded copper (DBC) substrate includes a copper pattern layer for connecting the upper electrode and the lower electrode to a circuit element; and a copper (Cu) wire that connects the upper electrode and the Cu pattern layer.

In example embodiments of inventive concepts, the lower electrode and the Cu pattern layer may be connected to each other by using soldering or sintering.

In example embodiments of inventive concepts, a material of the first contact layer may be the same as a material of the second contact layer, and a material of the first bonding pad layer may be the same as a material of the second bonding pad layer.

In example embodiments of inventive concepts, the first bonding pad layer and the second bonding pad layer may each include at least one of phosphorus (P) and boron (B) as an impurity.

In example embodiments of inventive concepts, the first bonding pad layer and the second bonding pad layer may each have a thickness ranging from about 3 μm to about 20 μm.

In example embodiments of inventive concepts, the first contact layer and the second contact layer may each include a metal containing aluminum (Al).

In example embodiments of inventive concepts, the upper electrode may further include a first protective layer and the lower electrode may further include a second protective layer. The first protective layer may be on the first bonding pad layer and may protect the first bonding pad layer. The second bonding pad layer may be on the second protective layer. The second protective layer may protect the second bonding pad layer.

In example embodiments of inventive concepts, the first protective layer and the second protective layer may each include at least one of gold (Au) or palladium (Pd).

In example embodiments of inventive concepts, the first protective layer may include: a first Pd layer having a metal containing Pd that is on the first bonding pad layer; and a first Au layer having a metal containing Au that is on the first Pd layer. In example embodiments of inventive concepts, the second protective layer may include: a second Pd layer having a metal containing Pd that supports the second bonding pad layer, and a second Au layer having a metal containing Au that supports the second Pd layer.

In example embodiments of inventive concepts, the semiconductor structure may include one of an insulated-gate bipolar transistor (IGBT) and a metal-oxide-semiconductor field-effect transistor (MOSFET). In example embodiments of inventive concepts, the semiconductor structure may include a diode.

According to example embodiments of inventive concepts, a method of manufacturing a power device includes: preparing a semiconductor structure having a first surface facing a second surface; and forming an upper electrode and a lower electrode on the first surface and the second surface of the semiconductor structure respectively by, forming a contact layer that contacts the semiconductor structure and by forming a bonding pad layer having a metal containing nickel (Ni) on the contact layer.

In example embodiments of inventive concepts, the forming the bonding pad layer may include simultaneously forming a first bonding pad layer of the upper electrode and forming a second bonding pad layer of the lower electrode.

In example embodiments of inventive concepts, the forming the upper electrode and the lower electrode may further include forming on the bonding pad layer a protective layer that protects the bonding pad layer.

In example embodiments of inventive concepts, the forming the bonding pad layer may include performing electroless Ni plating.

In example embodiments of inventive concepts, the forming the bonding pad layer may further include performing zincation before the performing the electroless Ni plating.

In example embodiments of inventive concepts, the forming of the bonding pad layer may further include performing heat treatment after the performing of the electroless Ni plating.

In example embodiments of inventive concepts, the protective layer may be formed by using gold (Au) or palladium (Pd) plating.

According to example embodiments of inventive concepts, a power device includes a pair of electrodes at different surfaces respectively of a semiconductor structure. The pair of electrodes each include a contact layer that is connected to a bonding pad layer that includes a metal containing Ni.

In example embodiments of inventive concepts, the different surfaces of the semiconductor structure may be an upper surface and a lower surface respectively, the contact layer of one of the pair of electrodes may be electrically connected to the lower surface of the semiconductor structure, the contact layer of an other of the pair of electrodes may be electrically connected to the upper surface of the semiconductor structure, and a material of the bonding pad layer of the one of the pair of electrodes may be the same as a material of the bonding pad layer of the other of the pair of electrodes.

In example embodiments of inventive concepts, a gate electrode may be on the upper surface of the semiconductor structure, and the gate electrode may include a bonding pad layer having a metal containing Ni.

In example embodiments of inventive concepts, the semiconductor structure may include one of an insulated-gate bipolar transistor (IGBT), a metal-oxide-semiconductor field-effect transistor (MOSFET), and a diode.

In example embodiments of inventive concepts, a power device module may include a substrate including a metal pattern layer, the foregoing power device on the substrate, and a wire that connects one of the pair of electrodes to the metal pattern layer of the substrate. At least one of the wire and the metal pattern layer contains a metal may have at least one of a lower resistivity than a resistivity of aluminum (Al), a higher thermal conductivity than a thermal conductivity of Al, and a lower coefficient of thermal expansion (CTE) than a CTE of Al

BRIEF DESCRIPTION OF THE DRAWINGS

These and/or other aspects will become apparent and more readily appreciated from the following description of non-limiting embodiments of inventive concepts, as illustrated in the accompanying drawings. The drawings are not necessarily to scale, emphasis instead being placed upon illustrating the principles of inventive concepts. In the drawings.

DETAILED DESCRIPTION

Figure 1:
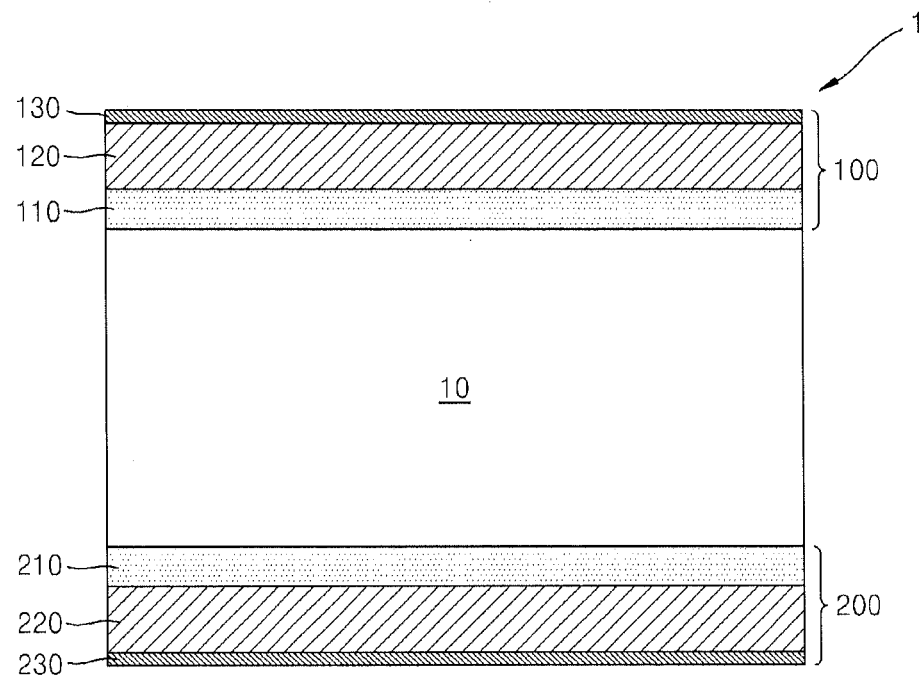
FIG. 1 is a cross-sectional view illustrating a power device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and spatially relative descriptors used herein interpreted accordingly.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The term "layer" used herein refers to a part of a structure formed by stacking objects. Accordingly, the meaning of the term "layer" should not be confined by thicknesses of the objects.

FIG. 1 is a cross-sectional view illustrating a power device 1 according to example embodiments of inventive concepts.

Referring to FIG. 1, the power device 1 includes a semiconductor structure 10 having a first surface and a second surface which face each other. An upper electrode 100 including a first bonding pad layer 120 and a first contact layer 110 is disposed on the first surface of the semiconductor structure 10. The first bonding pad layer 120 is disposed on the first contact layer 110 and is formed of a metal including nickel (Ni). A lower electrode 200 including a second contact layer 210 and a second bonding pad layer 220 is disposed so the second surface of the semiconductor structure 10 is on the second contact layer 210. The second bonding pad layer 220 is disposed on the second contact layer 210 and is formed of a metal including Ni. Also, the upper electrode 100 of the power device 1 may further include a first protective layer 130 that is disposed on the first bonding pad layer 120 and protects the first bonding pad layer 120, and the lower electrode 200 of the power device 1 may further include a second protective layer 230 that is disposed under the second bonding pad layer 220 and protects the second bonding pad layer 220.

The semiconductor structure 10 may be a high power semiconductor structure in which current of several amperes (A) to several kilo amperes (kA) may flow. For example, the semiconductor structure 10 may be a semiconductor structure for a rectifying diode, a power metal-oxide-semiconductor field-effect transistor (MOSFET), an insulated-gate bipolar transistor (IGBT), or a triode for alternating current (TRIAC). However, example embodiments of inventive concepts are not limited thereto, and the semiconductor structure 10 may be a low power semiconductor structure.

The upper electrode 100 and the lower electrode 200 are elements for applying a voltage to operate the semiconductor structure 10. Accordingly, each of the upper electrode 100 and the lower electrode 200 may include a conductive material. For example, each of the upper electrode 100 and the lower electrode 200 may be formed of a metal, a metal alloy, a conductive metal oxide, or a conductive metal nitride.

Also, the upper electrode 100 includes the first contact layer 110 that contacts one surface of the semiconductor structure 10 (e.g., the first surface) and the first bonding pad layer 120. The lower electrode 200 includes the second contact layer 210 that contacts the other surface of the semiconductor structure (e.g., the second surface) and the second bonding pad layer 220.

Each of the first contact layer 110 and the second contact layer 210 may directly contact the semiconductor structure 10 and may be formed to have a single-layer structure or a multi-layer structure. Each of the first contact layer 110 and the second contact layer 210 may include a conductive material. For example, each of the first contact layer 110 and the second contact layer 210 may be formed of a metal, a metal alloy, a conductive metal oxide, or a conductive metal nitride. In detail, each of the first contact layer 110 and the second contact layer 210 may include at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr), and combinations thereof.

Each of the first contact layer 110 and the second contact layer 210 may be formed by using a deposition method such as, but not limited to, chemical vapor deposition (CVD), plasma enhanced CVD (PECVD), low pressure CVD (LPCVD), physical vapor deposition (PVD), sputtering, or atomic layer deposition (ALD).

Each of the first bonding pad layer 120 and the second bonding pad layer 220 may be formed to connect the power device 1 and a direct bonded copper (DBC) substrate or the like by using a Cu wire or by using soldering or sintering. The DBC substrate refers to a substrate which is formed of ceramic such as $Al_2O_3$ or AlN and has both surfaces on which a Cu layer is disposed. The DBC substrate may be provided in order to insulate the power device 1.

The first bonding pad layer 120 and the second bonding pad layer 220 are respectively disposed on the first contact layer 110 and under the second contact layer 210 and each include Ni. Each of the first bonding pad layer 120 and the second bonding pad layer 220 may be formed by using electroless Ni plating. In this case, the first bonding pad layer 120 and the second bonding pad layer 220 may be simultaneously formed. Each of the bonding pad layer 120 and the second bonding pad layer 220 may include phosphorus (P) or boron (B) along with Ni. Each of the first bonding pad layer 120 and the second bonding pad layer 220 may be formed to a thickness ranging from about 3 μm to about 20 μm. The first bonding layer 120 may directly contact the first contact layer 110 and the second bonding layer 220 may directly contact the second contact layer 210.

Since the first bonding pad layer 120 includes Ni, and Ni has a greater strength and hardness than a strength and hardness of a Cu wire, the first bonding pad layer 120 may limit (and/or prevent) the power device 1 from being damaged by an external force applied to the power device 1 when the power device 1 is bonded to the Cu wire. Also, after or when the power device 1 is bonded to the Cu wire, the first bonding pad layer 120 may serve as a barrier layer that limits (and/or prevents) Cu from diffusing to the semiconductor structure 10.

In general, a power device and a DBC substrate may be electrically connected to each other by wire bonding using an Al wire having a diameter ranging from about 200 μm to about 500 μm. The wire bonding may be performed by applying pressure and ultrasonic energy to a surface of an electrode contacting the Al wire. In order to reduce (and/or minimize) internal impedance and enhance reliability after the wire bonding, various properties such as electrical, thermal, and physical properties of the Al wire may be considered.

Electrical, thermal, and physical properties of an Al wire and a Cu wire are compared as follows.

TABLE 1

| Items | Al wire | Cu wire |
| --- | --- | --- |
| Resistivity | 2.7 mΩcm | 1.7 mΩcm |
| Fusing current | 15 A (diameter 10 mil × 10 mm) | 24 A (diameter 10 mil × 10 mm) |
| Thermal conductivity | 220 W/mK | 400 W/mK |
| Coefficient of thermal expansion (CTE) | 23.6 ppm | 16.5 ppm |
| Hardness | 200-500 (N/mm$^2$) | 400-1100 (N/mm$^2$) |

As shown in Table 1, the Cu wire has better electrical properties and thermal properties than the Al wire. Accordingly, when wire bonding is performed by using the Cu wire, electrical and thermal performance may be improved. Also, since a CTE of the Cu wire is less than a CTE of the Al wire, even when the Cu wire is used and heat is generated due to power supply, cracks occurring on a contact surface between the Cu wire and an electrode may be reduced.

Since the second bonding pad layer 220 has wettability with a solder, connection using soldering may be facilitated. Also, since the second bonding pad layer 220 is formed of almost the same material to almost the same thickness as the first bonding pad layer 120, the second bonding pad layer 220 may reduce warpage of the power device 1. Functions of the first bonding pad layer 120 and the second bonding pad layer may be exchanged.

The first protective layer 130 and the second protective layer 130 may be respectively disposed on the first bonding pad layer 120 and the second bonding pad layer 220. The first protective layer 130 and the second protective layer 230 may be formed to respectively protect the first bonding pad layer 120 and the second bonding pad layer 220, and may limit (and/or prevent) the first bonding pad layer 120 and the second bonding pad layer 220 from being oxidized.

Each of the first protective layer 130 and the second protective layer 230 may have a single-layer structure or a multi-layer structure. For example, each of the first protective layer 120 and the second protective layer 130 may have a single-layer structure including Au or Pd, or a multi-layer structure including a combination of Au and Pd. However, example embodiments of inventive concepts are not limited thereto as long as the first protective layer 130 and the second protective layer 230 are respectively disposed on the first bonding pad layer 120 and the second bonding pad layer 220 and protect the first bonding pad layer 120 and the second bonding pad layer 220. Each of the first protective layer 130 and the second protective layer 230 may be formed by using immersion plating or electroless plating. For example, if each of the first protective layer 130 and the second protective layer 230 is formed of Au, each of the first protective layer 130 and the second protective layer 230 may be formed by using immersion plating. If each of the first protective layer 130 and the second protective layer 230 is formed of Pd, each of the first protective layer 130 and the second protective layer 230 may be formed by using electroless plating.

A stacked structure of the upper electrode 100 and a stacked structure of the lower electrode 200 of the power device 1 may be the same. For example, the first and second contact layers 110 and 210, the first and second bonding pad layers 120 and 220, and the first and second protective layers 130 and 230 may be sequentially formed by using the same materials. In detail, both the upper electrode 100 and the lower electrode 200 may be formed of Al/Ni/Au or Al/Ni/Pd/

Au. Also, thicknesses of layers constituting the upper electrode 100 and the lower electrode 200 may be the same (and/or almost the same). However, example embodiments of inventive concepts are not limited thereto. For example, an additional layer may be further formed on any one of the upper electrode 100 and the lower electrode 200, and thicknesses of layers constituting the upper electrode 100 and the lower electrode 200 may be different.

Figure 2:
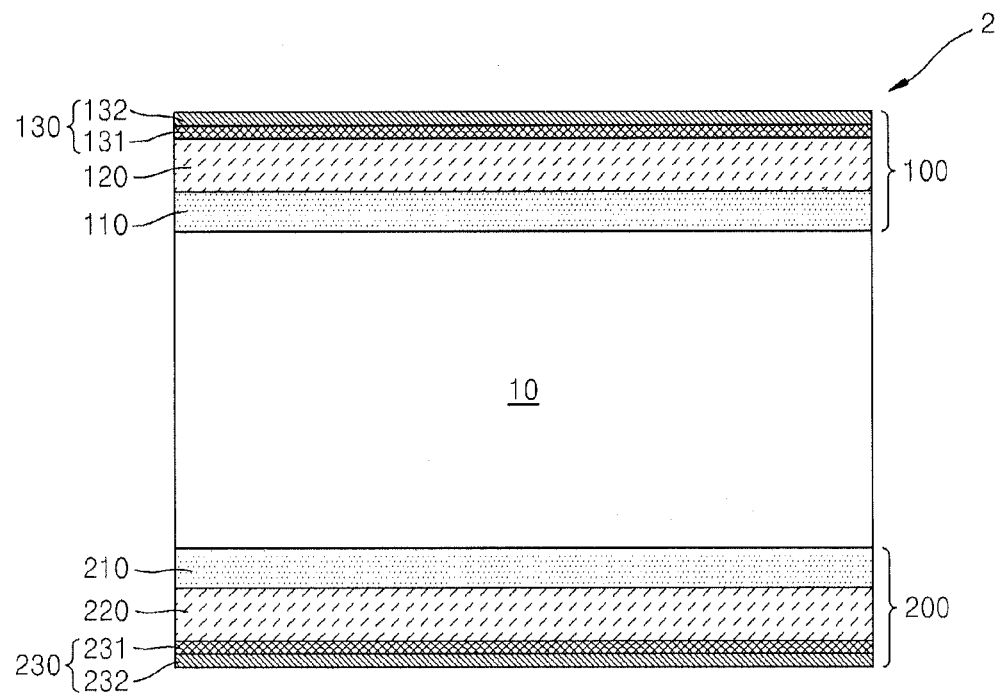
FIG. 2 is a cross-sectional view illustrating a power device according to example embodiments of inventive concepts.

FIG. 2 is a cross-sectional view illustrating a power device 2 according to example embodiments of inventive concepts.

Referring to FIG. 2, the power device 2 includes the semiconductor structure 10 having a first surface and a second surface which face each other. The upper electrode 100 including the first bonding pad layer 120 and the first contact layer 110 is disposed on the first surface of the semiconductor structure 10. The first bonding pad layer 120 is disposed on the first contact layer 110 and is formed of a metal including Ni. The lower electrode 200 including the second contact layer 210 and the second bonding pad layer 200 is disposed so the second surface of the semiconductor structure 10 is on the second contact layer 210. The second contact layer 210 and is formed of a metal including Ni. Also, the upper electrode 100 of the power device 2 may further include the first protective layer 130 that is disposed on the first bonding pad layer 120 and protects the first bonding pad layer 120, and the lower electrode 200 of the power device 2 may further include the second protective layer 230 that is disposed under the second bonding pad layer 220 and protects the second bonding pad layer 220.

Also, the first protective layer 130 may include a first Pd layer 131 that is disposed on the first bonding pad layer 120 and is formed of a metal including Pd, and a first Au layer 132 that is disposed on the first Pd layer 131 and is formed of a metal including Au. The second protective layer 230 may include a second Pd layer 231 that is disposed under the second bonding pad layer 220 and is formed of a metal including Pd, and a second Au layer 232 that is disposed under the second Pd layer 231 and is formed of a metal including Au.

The power device 2 of FIG. 2 is the same as the power device 1 of FIG. 1 except that the first protective layer 130 may include the first Pd layer 131 and the first Au layer 132, and the second protective layer 230 may include the second Pd layer 231 and the second Au layer 232. Accordingly, the elements other than the first Pd layer 131 and the second Pd layer 231, and the first Au layer 132 and the second Au layer 232 will not be explained.

The first Pd layer 131 and the second Pd layer 231, and the first Au layer 132 and the second Au layer 232 may be formed to respectively protect the first and second bonding pad layers 120 and 220, and particularly respectively limit (and/or prevent) the first and second bonding pad layers 120 and 220 from being oxidized. The first Pd layer 131 and the second Pd layer 231 may be simultaneously formed by using electroless plating. Next, immersion plating may be sequentially performed in order to form the first Au layer 132 and the second Au layer 232. However, the example embodiments of inventive concepts are not limited thereto.

A thickness of each of the first Pd layer 131 and the second Pd layer 231 may be equal to or less than 0.3 μm, and a thickness of each of the first Au layer 132 and the second Au layer 232 may be equal to or less than 0.1 μm. However, example embodiments of inventive concepts are not limited thereto, and the thickness may be increased if necessary.

Figure 3:
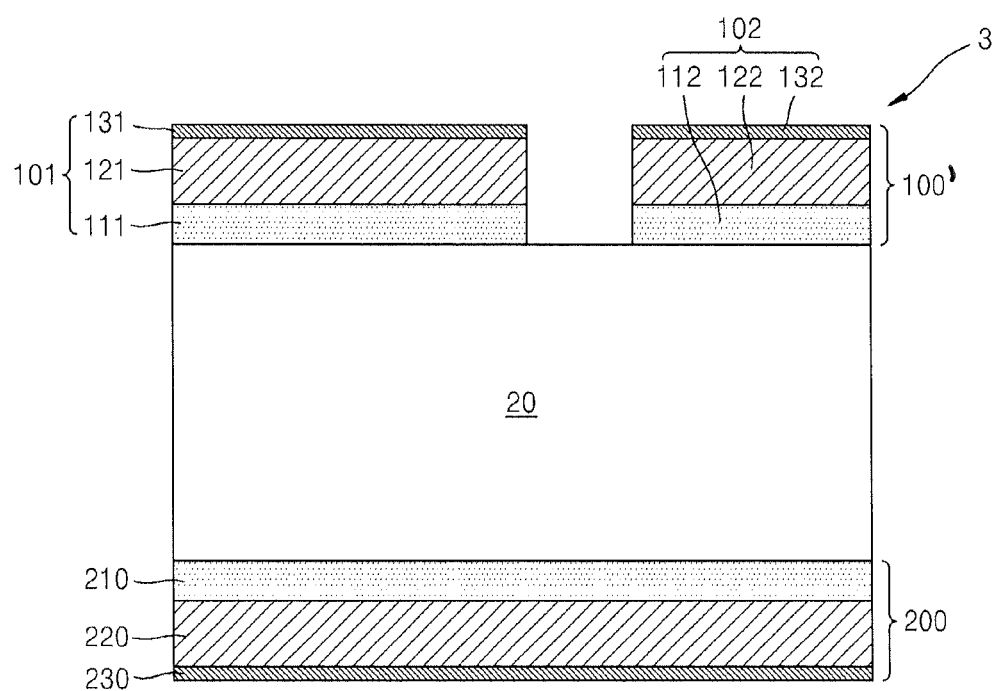
FIG. 3 is a cross-sectional view illustrating a power device according to example embodiments of inventive concepts.

FIG. 3 is a cross-sectional view illustrating a power device 3 according to example embodiments of inventive concepts.

Referring to FIG. 3, the power device 3 includes a semiconductor structure 20 having a first surface and a second surface which face each other. An upper electrode 100' is disposed on the first surface of semiconductor structure 20 and the lower electrode 200 is disposed so the second surface of the semiconductor structure 20 is on the lower electrode 200. The upper electrode 100' includes a first upper electrode 101 and a second upper electrode 102. The first upper electrode 101 and the second upper electrode 102 may include first contact layers 111 and 112, respectively, that are on the first surface of the semiconductor structure 20. A material of the first contact layers 111 and 112 may be the same as a material of the first contact layer 110 described previously with reference to FIGS. 1-2. The first upper electrode 101 and the second upper electrode 102 may include first bonding pad layers 121 and 122 on the first contact layers 111 and 112 respectively. The first bonding pad layers 121 and 122 may be formed of the same material as the first bonding pad layer 120 described previously with respect to FIGS. 1-2. That is, the first bonding pad layers 121 and 122 may be formed of a metal including Ni. The lower electrode 200 including the second contact layer 210 is disposed under the second surface of the semiconductor structure 20 so the semiconductor structure 20 is on the second contact layer 210. The second bonding pad layer 220 that is disposed under the second contact layer 210 and is formed of a metal including Ni.

Also, the upper electrode 100' of the power device 3 may further include the first protective layers 131 and 132 that are disposed on the first bonding pad layers 121 and 122 of the first upper electrode 101 and the second upper electrode 102, respectively. The first protective layers 131 and 132 protect the first bonding pad layers 121 and 122 of the first upper electrode 101 and the second upper electrode 102, respectively. A material of the first protective layers 131 and 132 may be the same as a material of the first protective layer 130 described previously with respect to FIGS. 1-2.

The lower electrode 200 of the power device 3 may further include the second protective layer 230 that is disposed under the second bonding pad layer 220 and protects the second bonding pad layer 220. The first upper electrode 101 and the second upper electrode 102 may be spaced apart from each other. A material of the second protective layer 230 may be the same as a material of the second protective layer 230 described previously with respect to FIGS. 1-2.

The power device 3 of FIG. 3 may be the same as the power device 1 of FIG. 1 except that the upper electrode 100' in FIG. 3 includes the first upper electrode 101 and the second upper electrode 102. Accordingly, the elements other than the first upper electrode 101 and the second upper electrode 102 will not be explained.

A plurality of the upper electrodes 100' and the lower electrodes 200 may be provided. Since the upper electrodes 100' and the lower electrodes 200 are elements for applying a voltage to operate the semiconductor structure 20, the number of the upper electrodes 100' and the lower electrodes 200 may vary according to a type of the semiconductor structure 20. Although 2 upper electrodes 101 and 102 are shown in FIG. 3, the number of the upper electrodes 100' may be greater than 2. Also, a plurality of the lower electrodes 200 may be provided if necessary.

In FIG. 3, the semiconductor structure 20 may be an IGBT or a MOSFET. In this case, the first upper electrode 101 may be an emitter electrode and the second upper electrode 102 may be a gate electrode. Also, the lower electrode 200 may be a collector electrode. However, example embodiments of inventive concepts are not limited thereto, and the electrodes may vary according to a structure of the semiconductor structure 20.

Figure 4A:
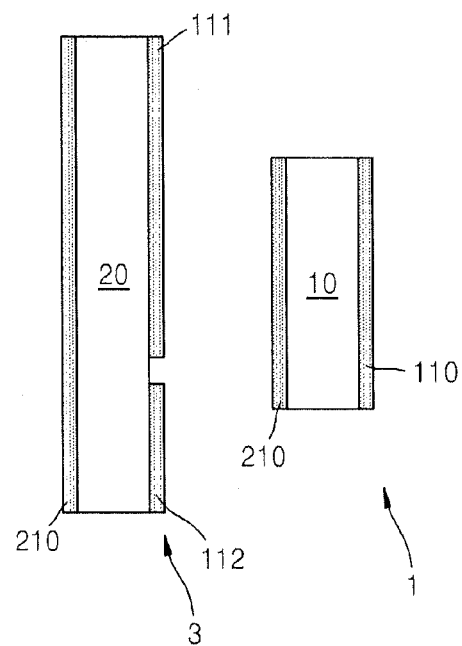
FIGS. 4A through 4C are cross-sectional views for explaining a process of forming electrodes of the power devices of FIGS. 1 and 3.
Figure 4B:
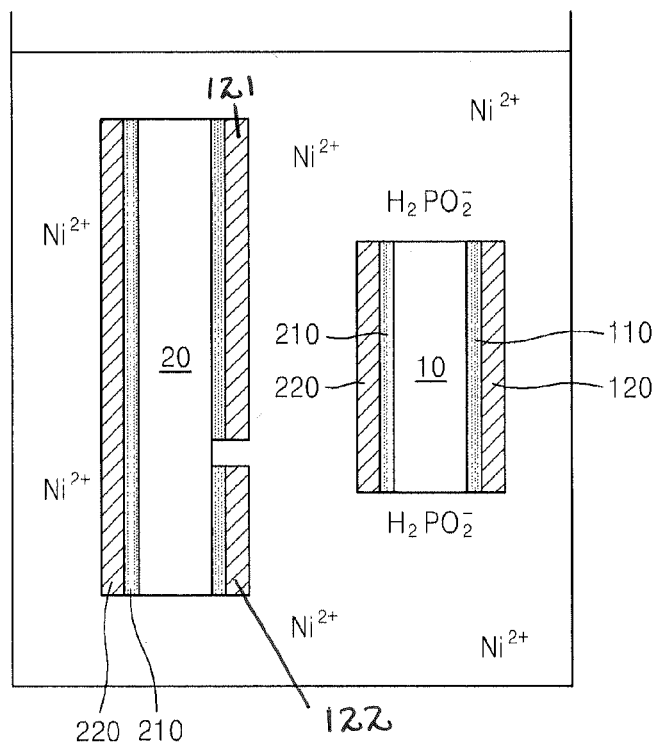
Figure 4C:
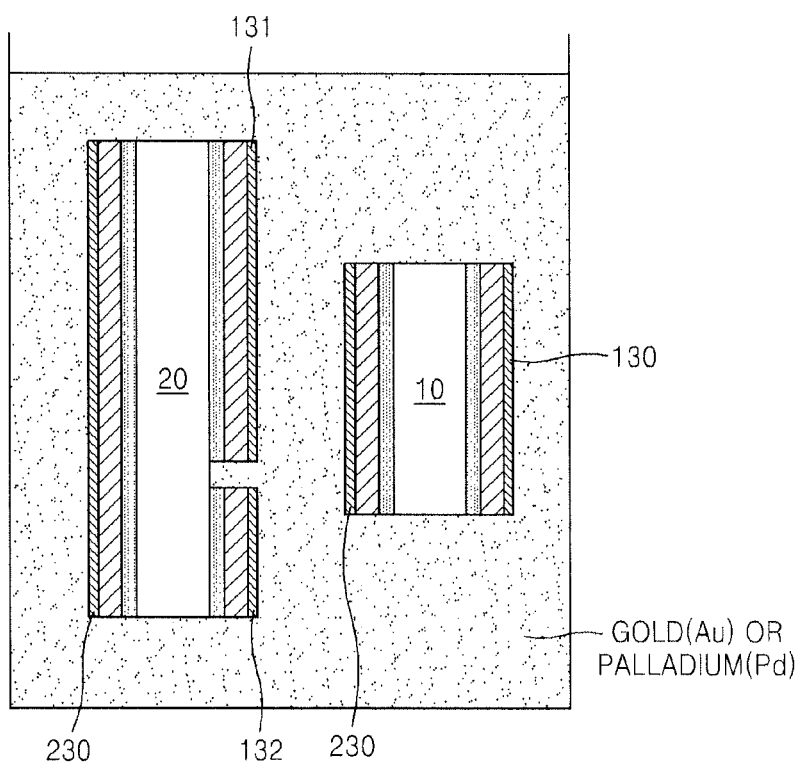

FIGS. 4A through 4C are cross-sectional views for explaining a process of forming electrodes of the power devices 1 and 3 of FIGS. 1 and 3. The same element as those of FIGS. 1, 3, and 4A through 4C are denoted by the same reference numerals.

Referring to FIG. 4A, the first and second contact layers 110, 111, 112, and 210 are formed on the semiconductor structures 10 and 20. The first and second contact layers 110, 111, 112, and 210 may be formed by using a deposition method such as, but not limited to, PECVD, LPCVD, PVD, sputtering, or ALD.

Referring to FIG. 4B, electroless Ni plating is performed in order to form the first and second bonding pad layers 120, 121, 122, and 220 on the first and second contact layers 110, 111, 112, and 210. The electroless Ni plating is performed due to chemical reduction. A reducing agent used in the electroless Ni plating may be sodium hypophosphite or a B compound. Accordingly, each of the first and second bonding pad layers 120, 121, 122 and 220 may include P or B according to a type of the reducing agent.

The electroless Ni plating has a higher deposition rate and lower manufacturing costs than vacuum deposition used to form a Ni layer. Also, since the first bonding pad layers 120, 121, and 122 and the second bonding pad layer 220 may be simultaneously formed, manufacturing time and costs may be reduced.

Before the electroless Ni plating, zincation may be performed on surfaces of the first and second contact layers 110, 111, 112, and 210 in order to improve an adhesive force between the first and second contact layers 110, 111, 112, and 210 and Ni to be plated. Due to the zincation, metal atoms of the first and second contact layers 110, 111, 112, and 210 may be displaced by Zn atoms, and the Zn atoms deposited on the first and second contact layers 110, 111, 112, and 210 may improve an adhesive force between the first and second contact layers 110, 111, 112, and 210 and Ni.

The first and second bonding pad layers 120, 121, 122, and 220 formed by using the electroless Ni plating may be subjected to heat treatment in order to adjust an adhesive force and/or mechanical properties.

Referring to FIG. 4C, Au plating or Pd plating may be performed in order to form the first and second protective layers 130, 131, 132, and 230 on the first and second bonding pad layers 120, 121, 122, and 220. The first and second protective layers 130, 131, 132, and 230 may be provided in order to limit (and/or prevent) the first and second bonding pad layers 120, 121, 122, and 220 from being oxidized. Each protective layer may be formed of Pd/Au. In this case, electroless plating may be first performed in order to form a layer including Pd, and then immersion plating may be sequentially performed in order to form a layer including Au. However, the example embodiments of inventive concepts are not limited thereto, and electroless plating may be performed in order to perform Au plating.

Figure 5:
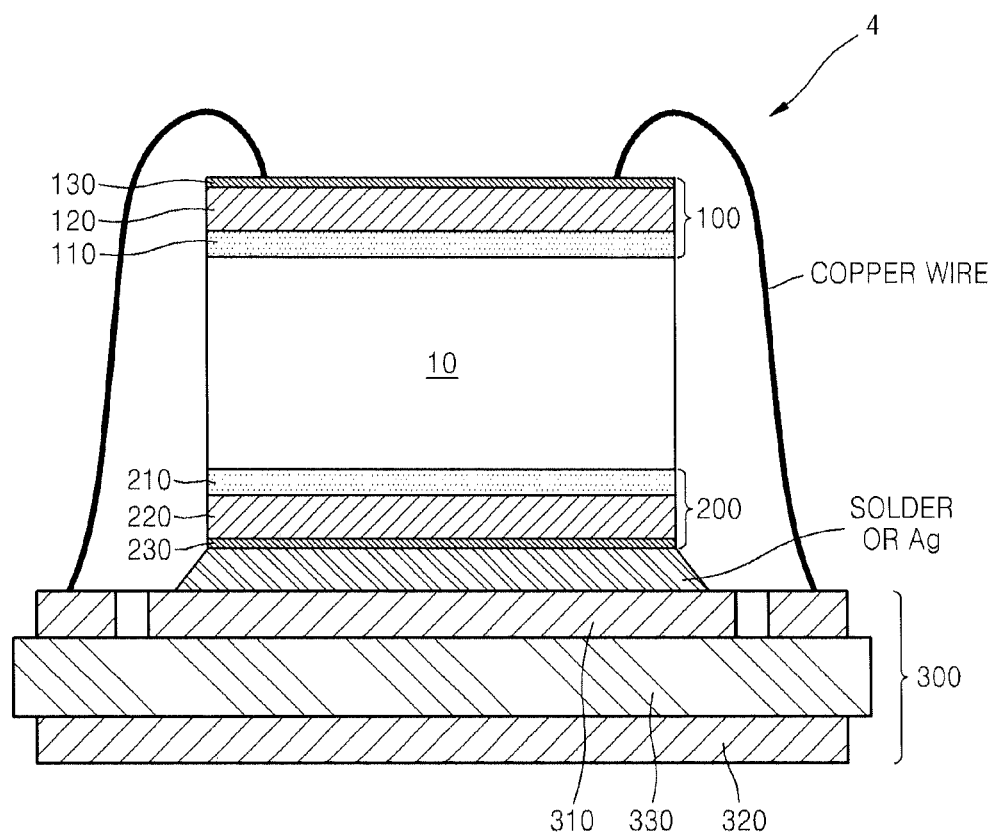
FIG. 5 is a cross-sectional view illustrating a power device module according to example embodiments of inventive concepts.

FIG. 5 is a cross-sectional view illustrating a power device module 4 according to example embodiments of inventive concepts.

Referring to FIG. 5, the power device module 4 includes the semiconductor structure 10 having a first surface and a second surface which face each other; the upper electrode 100 including the first contact layer 110 that is disposed on the first surface, and the first bonding pad layer 120 that is disposed on the first contact layer 110 and is formed of a metal including Ni; the lower electrode 200 including the second contact layer 210 that is disposed on the second surface, and the second bonding pad layer 220 that is disposed on the second contact layer 210 and is formed of a metal including Ni; a DBC substrate 300 including a Cu pattern layer 310 on which a pattern for connecting the upper electrode 100 and the lower electrode 200 to a desired (and/or alternatively predetermined circuit element) is formed; and a Cu wire that connects the upper electrode 100 and the Cu pattern layer 310.

Also, the upper electrode 100 of the power device module 4 may further include the first protective layer 130 that is disposed on the first bonding pad layer 120 and protects the first bonding pad layer 120, and the lower electrode 200 of the power device module 4 may further include the second protective layer 230 that is disposed under the second bonding pad layer 220 and protects the second bonding pad layer 220.

Also, the lower electrode 200 and the Cu pattern layer 310 may be connected to each other by using soldering or sintering.

The power device module 4 may include the power device 1, 2, or 3, the DBC substrate 300 including the Cu pattern layer 310 on which the pattern for connecting the power device 1, 2, or 3 to the desired (and/or alternatively predetermined) circuit element is formed, and the Cu wire that connects the power device 1, 2, or 3 and the DBC substrate 300. The lower electrode 200 and the DBC substrate 300 may be connected to each other by using soldering or sintering.

The DBC substrate 300 includes the Cu pattern layer 310, a Cu layer 320, and a ceramic layer 330 that is disposed between the Cu layer 320 and the Cu pattern layer 310. The Cu pattern layer 310 includes the pattern for connecting the power device 1, 2, or 3 to the predetermined circuit element. The ceramic layer 330 may be formed of ceramic such as $Al_2O_3$, or AlN for electrical insulation.

The DBC substrate 300 may provide a path through which high power may be supplied to the power device 1, 2, or 3, and may dissipate heat generated by the power device 1, 2, or 3 to the outside.

The Cu wire may have a diameter that is equal to or greater than 100 μm. The Cu wire may be connected to the upper electrode 100 of the power device 1, 2, or 3 and the Cu pattern layer 310 of the DBC substrate 300 by using ultrasonic wedge bonding.

The lower electrode 200 of the power device 1, 2, or 3 may be connected to the Cu pattern layer 310 by using soldering or silver (Ag) sintering. When soldering is used, a material used in the soldering may be Sn—Pb or Sn—Ag—Cu. When Ag sintering is used, nano or micro-sized silver paste may be used and pressure and heat may be applied.

Figure 6:
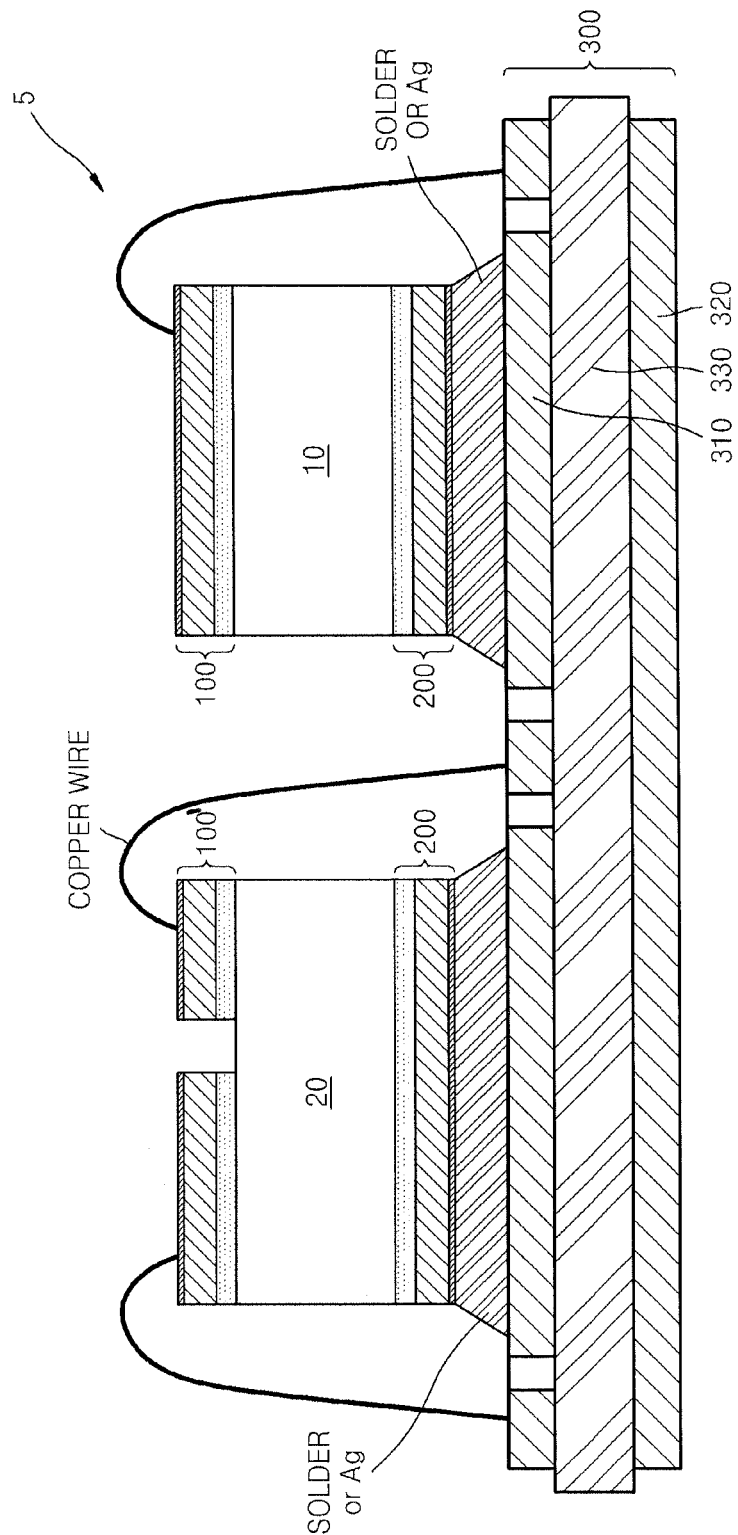
FIG. 6 is a cross-sectional view illustrating a power device module according to example embodiments of inventive concepts.

FIG. 6 is a cross-sectional view illustrating a power device module 5 according to example embodiments of inventive concepts.

Referring to FIG. 6, in the power device module 5, a plurality of the power devices 1, 2, or 3 are provided. Although 2 power devices are shown in FIG. 6, the example embodiments of inventive concepts are not limited thereto and a various number of power devices may be provided according to a function of the power device module 5.

As described above, since the power device 1, 2, or 3 and the power device module 4 or 5 employ an electrode structure which facilitates connection by using a Cu wire and soldering or sintering, electrical and thermal performance reliability of the power device 1, 2, or 3 and the power device module 4 or 5 may be improved. Also, since the number of processes is reduced, manufacturing time and costs of the power device 1, 2, or 3 and the power device module 4 or 5 may be reduced.

Since the power device 1, 2, or 3 and the power device module 4 or 5 employ an electrode structure which facilitates connection by using a Cu wire and soldering or sintering, electrical and thermal performances and reliability of the power device 1, 2, or 3 and the power device module 4 or 5 may be improved. However, example embodiments of inventive concepts are not limited thereto, and detailed structures may be variously modified.

While some example embodiments have been particularly shown and described, it will be understood by one of ordinary skill in the art that variations in form and detail may be made therein without departing from the spirit and scope of the claims.

What is claimed is:

1. A power device comprising:
a semiconductor structure having a first surface facing a second surface;
an upper electrode on the first surface of the semiconductor structure,
the upper electrode including a first contact layer that is on the first surface of the semiconductor structure, and
the upper electrode including a first bonding pad layer that is on the first contact layer,
the first bonding pad layer including a metal containing nickel (Ni); and
a lower electrode arranged so the second surface of the semiconductor structure is on the lower electrode,
the lower electrode including a second contact layer that is under the second surface of the semiconductor structure, and
the lower electrode including a second bonding pad layer that is under the second contact layer,
the second bonding pad layer including a metal containing Ni,
wherein the upper electrode includes a plurality of the upper electrodes that are spaced apart from one another.

2. The power device of claim 1, wherein
a material of the first contact layer is the same as a material the second contact layer, and
a material of the first bonding pad layer is the same as a material of the second bonding pad layer.

3. The power device of claim 1, wherein the first bonding pad layer and the second bonding pad layer each include at least one of phosphorus (P) and boron (B) as an impurity.

4. The power device of claim 1, wherein the first contact layer and the second contact layer each include a metal containing aluminum (Al).

5. A power device comprising:
a semiconductor structure having a first surface facing a second surface;
an upper electrode on the first surface of the semiconductor structure,
the upper electrode including a first contact layer that is on the first surface of the semiconductor structure, and
the upper electrode including a first bonding pad layer that is on the first contact layer,
the first bonding pad layer including a metal containing nickel (Ni); and
a lower electrode arranged so the second surface of the semiconductor structure is on the lower electrode,
the lower electrode including a second contact layer that is under the second surface of the semiconductor structure, and
the lower electrode including a second bonding pad layer that is under the second contact layer,
the second bonding pad layer including a metal containing Ni, wherein
the upper electrode further includes a first protective layer, the first protective layer is on the first bonding pad layer and protects the first bonding pad layer,
the lower electrode layer further includes a second protective layer,
the second bonding pad layer is on the second protective layer, and
the second protective layer protects the second bonding pad layer.

6. The power device of claim 5, wherein first protective layer and the second protective layer each include at least one of gold (Au) and palladium (Pd).

7. The power device of claim 5, wherein
the first protective layer includes,
a first Pd layer having a metal containing Pd that is on the first bonding pad layer, and
a first Au layer having a metal containing Au that is on the first Pd layer; and
the second protective layer includes,
a second Pd layer having a metal containing Pd that supports the second bonding pad layer, and
a second Au layer having a metal containing Au that supports the second Pd layer.

8. The power device of claim 1, wherein the semiconductor structure includes one of an insulated-gate bipolar transistor (IGBT) and a metal-oxide-semiconductor field-effect transistor (MOSFET).

9. The power device of claim 1, wherein the semiconductor structure includes a diode.

10. A power device module comprising:
a semiconductor structure having a first surface facing a second surface;
an upper electrode on the first surface of the semiconductor structure,
the upper electrode including a first contact layer that is on the first surface of the semiconductor structure, and
the upper electrode including a first bonding pad layer that is on the first contact layer,
the first bonding pad layer including a metal that contains nickel (Ni);
a lower electrode arranged so the second surface of the semiconductor structure is on the lower electrode,
the lower electrode including a second contact layer that is under the second surface of the semiconductor structure, and
the lower electrode including a second bonding pad layer that is under the second contact layer,
the second bonding pad layer including a metal containing Ni;
a direct bonded copper (DBC) substrate including a copper pattern layer (Cu pattern layer) for connecting the upper electrode and the lower electrode to a circuit element; and
a copper (Cu) wire that connects the upper electrode and the Cu pattern layer.

11. The power device module of claim 10, wherein the lower electrode and the Cu pattern layer are connected to each other by soldering or sintering.

12. The power device module of claim 10, wherein
a material of the first contact layer is the same as a material of the second contact layer, and
a material of the first bonding pad layer is the same as a material of the second bonding pad layer.

13. The power device module of claim 10, wherein the first bonding pad layer and the second bonding pad layer each include at least one of phosphorus (P) and boron (B) as an impurity.

14. The power device module of claim 10, wherein the first bonding pad layer and the second bonding pad layer each have a thickness ranging from about 3 μm to about 20 μm.

15. The power device module of claim 10, wherein the first contact layer and the second contact layer each include a metal containing aluminum (Al).

16. The power device module of claim 10, wherein
the upper electrode further includes a first protective layer, the first protective layer is on the first bonding pad layer and protects the first bonding pad layer,
the lower electrode further includes a second protective layer, and the second protective layer is on the second bonding pad layer and protects the second bonding pad layer.

17. The power device module of claim 16, wherein the first protective layer and the second protective layer each include at least one of gold (Au) and palladium (Pd).

18. The power device module of claim 16, wherein
the first protective layer includes,
a first Pd layer having a metal containing Pd that is on the first bonding pad layer, and
a first Au layer having a metal containing Au that is on the first Pd layer; and
the second protective layer includes,
a second Pd layer having a metal containing Pd that supports the second bonding pad layer, and
a second Au layer having a metal containing Au that supports the second Pd layer.

19. The power device module of claim 10, wherein the semiconductor structure includes one of an insulated-gate bipolar transistor (IGBT) and a metal-oxide-semiconductor field-effect transistor (MOSFET).

20. The power device module of claim 10, wherein the semiconductor structure includes a diode.

21. A method of manufacturing a power device, the method comprising:
preparing a semiconductor structure having a first surface facing a second surface; and
forming an upper electrode and a lower electrode on the first surface and the second surface of the semiconductor structure respectively by,
forming a contact layer that contacts the semiconductor structure, and
forming a bonding pad layer having a metal containing nickel (Ni) on the contact layer,
wherein the forming the bonding pad layer includes performing electroless Ni plating.

22. The method of claim 21, wherein the forming the bonding pad layer includes simultaneously forming a first bonding pad layer of the upper electrode and forming a second bonding pad layer of the lower electrode.

23. A method of manufacturing a power device, the method comprising:
preparing a semiconductor structure having a first surface facing a second surface; and
forming an upper electrode and a lower electrode on the first surface and the second surface of the semiconductor structure respectively by,
forming a contact layer that contacts the semiconductor structure, and
forming a bonding pad layer having a metal containing nickel (Ni) on the contact layer,
wherein the forming the upper electrode and the lower electrode further includes forming on the bonding pad layer a protective layer that protects the bonding pad layer.

24. The method of claim 23, wherein the forming the protective layer includes performing gold (Au) or palladium (Pd) plating.

25. The method of claim 21, wherein the forming the bonding pad layer further includes performing zincation before the performing the electroless Ni plating.

26. The method of claim 21, wherein the forming the bonding pad layer further includes performing a heat treatment after the performing the electroless Ni plating.

27. A power device comprising:
a pair of electrodes at different surfaces respectively of a semiconductor structure,
a gate electrode on an upper surface of the semiconductor structure,
wherein the pair of electrodes each include a contact layer that is connected to a bonding pad layer that includes a metal containing Ni and the gate electrode includes a bonding pad layer having a metal containing Ni.

28. The power device of claim 27, wherein
the different surfaces of the semiconductor structure are the upper surface and a lower surface respectively,
the contact layer of one of the pair of electrodes is electrically connected to the lower surface of the semiconductor structure,
the contact layer of an other of the pair of electrodes is electrically connected to the upper surface of the semiconductor structure, and
a material of the bonding pad layer of the one of the pair of electrodes is the same as a material of the bonding pad layer of the other of the pair of electrodes.

29. The power device of claim 27, wherein the semiconductor structure includes one of an insulated-gate bipolar transistor (IGBT), a metal-oxide-semiconductor field-effect transistor (MOSFET), and a diode.

30. A power device module comprising:
a substrate including a metal pattern layer;
the power device of claim 27 on the substrate; and
a wire that connects one of the pair of electrodes to the metal pattern layer of the substrate,
wherein at least one of the wire and the metal pattern layer contains a metal having at least one of a lower resistivity than a resistivity of aluminum (Al), a higher thermal conductivity than a thermal conductivity of Al, and a lower coefficient of thermal expansion (CTE) than a CTE of Al.

* * * * *